(12) United States Patent
Meyers et al.

(10) Patent No.: US 7,592,204 B2
(45) Date of Patent: Sep. 22, 2009

(54) PACKAGE DESIGN OF SMALL DIAMETER SENSOR

(75) Inventors: Aaron J. Meyers, Cedarville, IL (US); William F. Eaton, Pearl City, IL (US); Abannl B. Maxwell, Knoxville, TN (US); Scott E. Michelhaugh, Freeport, IL (US)

(73) Assignee: Honeywell International Inc., Morristown, NJ (US)

( * ) Notice: Subject to any disclaimer, the term of this patent is extended or adjusted under 35 U.S.C. 154(b) by 137 days.

(21) Appl. No.: 11/998,730

(22) Filed: Nov. 29, 2007

(65) Prior Publication Data

US 2009/0142857 A1 Jun. 4, 2009

(51) Int. Cl.
*H01L 21/44* (2006.01)

(52) U.S. Cl. .......................... 438/124; 438/48; 438/51; 438/52; 438/122; 438/125; 438/127; 257/E21.504

(58) Field of Classification Search .................... 438/51
See application file for complete search history.

(56) References Cited

U.S. PATENT DOCUMENTS

2005/0205980 A1* 9/2005 Manansala .................. 257/680

* cited by examiner

*Primary Examiner*—N Drew Richards
*Assistant Examiner*—Kyoung Lee
(74) *Attorney, Agent, or Firm*—Richard H. Krukar; Kermit D. Lopez; Luis M. Ortiz

(57) ABSTRACT

A small sensor assembly is produced by encapsulating an inner package within an outer package. The inner assembly can have electrical components and sensors attached to a lead frame. The electrical components can be protected within inner packages that have alignment indentations. The alignment indentations are positioned over the outside edges of the lead frame and, preferably, no electrical components directly underlie the alignment indentations. The inner assembly is held in alignment by movable pins within a mold into which plastic is flowed. The mold is configured to cause some of the plastic to set earlier than the rest of the plastic and to hold the inner assembly in alignment within the mold. The movable pins can be retracted once enough plastic has set to hold the inner assembly. Unset plastic can then flow into the alignment indentations. A sealed sensor assembly is formed once all the plastic has set.

20 Claims, 6 Drawing Sheets

PACKAGE DESIGN OF SMALL DIAMETER SENSOR

TECHNICAL FIELD

Embodiments relate to packaging, semiconductor packaging, and sensor packaging. Embodiments also relate to plastic, plastic molding, thermoset material, and thermal plastic material.

BACKGROUND OF THE INVENTION

Semiconductor chips, circuitry, sensors and sensor subsystems are often packaged before deployment. Semiconductor chips are often packaged in ceramic or plastic packages that encapsulate and protect the chip. The chip package often contains a wire lead frame and a package. The chip, having bond pads, is wire bonded to the lead frame. The chip is then placed within the package and the package then sealed. The lead frame has leads that extend out of the sealed package and those leads can be bent into a final position such that the packaged chip can be easily attached to an electrical circuit.

Sensors can also be packaged with the caveat that the package must in some way transmit the environmental feature that the sensor is intended to measure. For example, a temperature sensor must transmit heat and a chemical sensor must be pervious to chemicals.

Sensor circuits containing packaged sensors and packaged sensors can also be packaged to form sealed sensor assemblies that can be easily deployed. Current technology provides sealed sensor assemblies that are by necessity large in order to align and protect sensor and associated circuitry. Systems and methods for providing smaller sealed sensor assemblies are needed.

BRIEF SUMMARY

The following summary is provided to facilitate an understanding of some of the innovative features unique to the embodiments and is not intended to be a full description. A full appreciation of the various aspects of the embodiments can be gained by taking the entire specification, claims, drawings, and abstract as a whole.

It is therefore an aspect of the embodiments to populate a lead frame with circuit components. A lead frame, being a wire pattern punched from a flat metallic sheet, has a length axis and a width axis but no meaningful depth axis. The lead frame has distinct sections that can perform slightly different functions. An interconnect section can act as a connection point for external circuitry to connect to the lead frame and, eventually, to the electrical components within the sealed sensor assembly. A sensor section is an area that can be populated by a sensor. A component section is an area that can be populated by electrical or electronic components such as integrated circuit chips, capacitors, resistors, inductors, and transistors. The sections are arranged linearly along the length axis of the lead frame.

The lead frame can be populated by wire binding techniques, surface mounting techniques or other techniques known to those practiced in the arts of semiconductor packaging or sensor packaging.

It is another aspect of the embodiments to protect the circuit components with an inner package. The inner package is fixed over the circuit components and to the lead frame. The inner package can be molded, positioned in place and then fastened. Alternatively, the inner piece can be molded in place by positioning a mold, flowing plastic into the mold, and then allowing the plastic to set. The inner package has alignment indentations over lead frame outside edges. The lead frame outside edges are parallel to the length axis and perpendicular to the width axis.

It is an additional aspect of the embodiments to form an inner assembly by fixing a sensor and an interconnect to the lead frame. The sensor is positioned in the sensor section while the interconnect is attached to the interconnect section.

It is a yet further aspect of the embodiments to position the inner assembly within a mold. Movable alignment pins engage the alignment indentations to hold the inner assembly inside and properly in aligned with the mold. Plastic is then flowed into the mold. The mold is configured to allow, or to cause, some of the plastic to set and hold the inner assembly in alignment within the mold before the rest of the plastic has set. For example, thermoplastic can set more quickly near a thinned section in the mold because heat flows more quickly out of the thermoplastic, into the thinned mold section, and thence to the environment.

It is a still yet further aspect of the embodiments that the movable pins are withdrawn from the alignment indentations after some of the plastic has set to hold the inner package in position. Plastic that has not yet set then flows into the alignment indentations and fills them.

It is yet an additional aspect of the embodiments to wait until all the plastic has set and thereby form a sealed sensor assembly.

BRIEF DESCRIPTION OF THE DRAWINGS

The accompanying figures, in which like reference numerals refer to identical or functionally similar elements throughout the separate views and which are incorporated in and form a part of the specification, further illustrate aspects of the embodiments and, together with the background, brief summary, and detailed description serve to explain the principles of the embodiments.

DETAILED DESCRIPTION

The particular values and configurations discussed in these non-limiting examples can be varied and are cited merely to illustrate at least one embodiment and are not intended to limit the scope thereof. In general, the figures are not to scale.

A small sensor assembly is produced by encapsulating an inner package within an outer package. The inner assembly can have electrical components and sensors attached to a lead frame. The electrical components can be protected within inner packages that have alignment indentations. The alignment indentations are positioned over the outside edges of the lead frame and, preferably, no electrical components directly underlie the alignment indentations. The inner assembly is held in alignment by movable pins within a mold into which plastic is flowed. The mold is configured to cause some of the plastic to set earlier than the rest of the plastic and to hold the inner assembly in alignment within the mold. The movable pins can be retracted once enough plastic has set to hold the inner assembly. Unset plastic can then flow into the alignment indentations. A sealed sensor assembly is formed once all the plastic has set.

Figure 1:
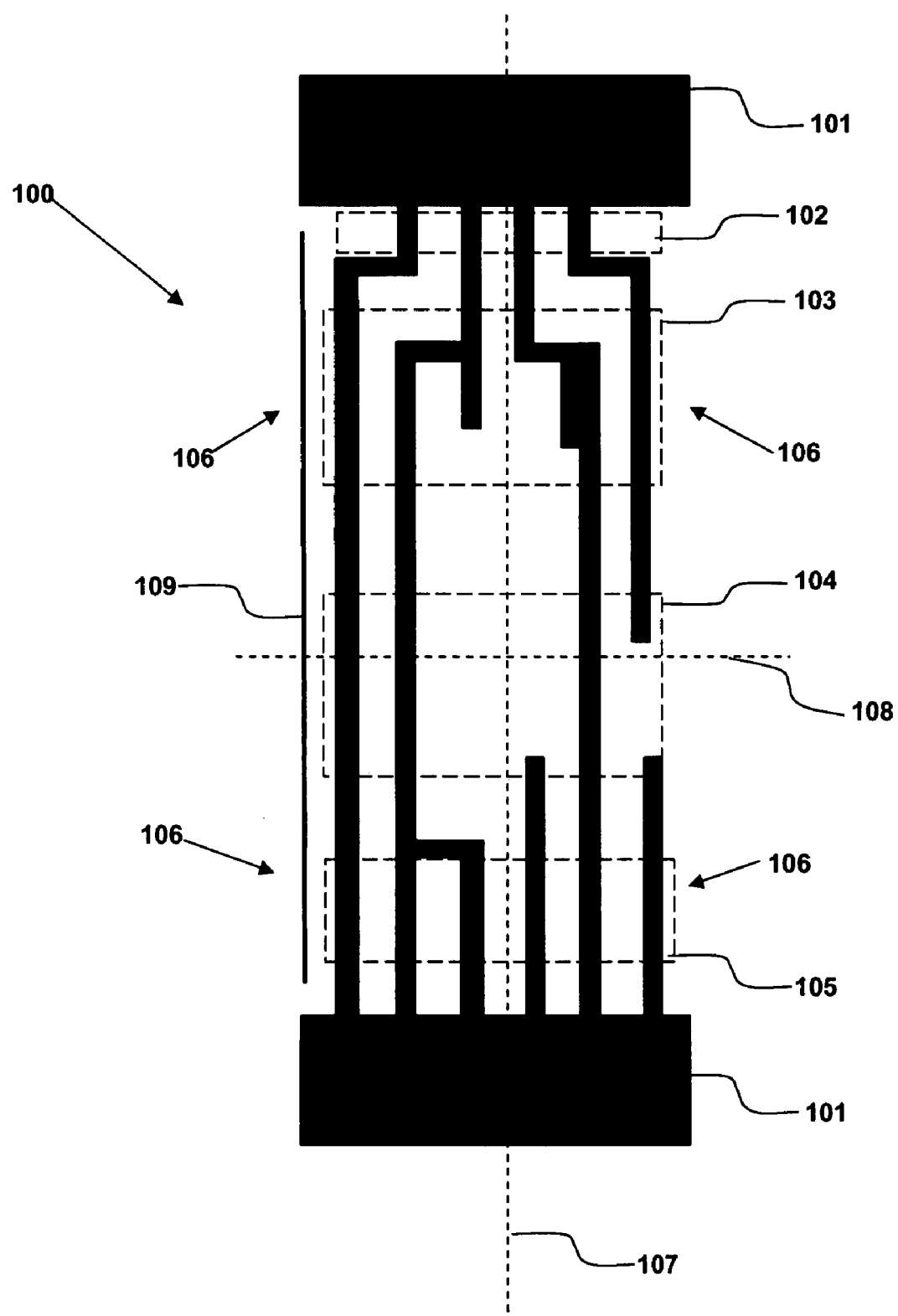
FIG. 1 illustrates a lead frame in accordance with aspects of the embodiments.

FIG. 1 illustrates a lead frame 100 in accordance with aspects of the embodiments. Sacrificial framing 101 holds each lead frame within a sheet of lead frames or reel of lead frames. An interconnect section 102 is an area to which an interconnect is intended to be attached. Electrical component sections 103, 105 are areas in which electrical components are to be attached. A sensor section 104 is an area to which a sensor is to attached. Alignment zones 106 are areas over which alignment indentations are to be located.

The lead frame 100 has a length axis 107 and a width axis 108. One outside edge 109 of the lead frame has two outside edges is shown. Outside edges 109 are parallel to the length axis 107 and perpendicular to the width axis 108. Note that the lead frame is flat and, as such, has an insignificant depth axis. The depth axis is perpendicular to the length axis 107 and width axis 108. The alignment zones 106 are position along the lead frame outside edges.

Figure 2:
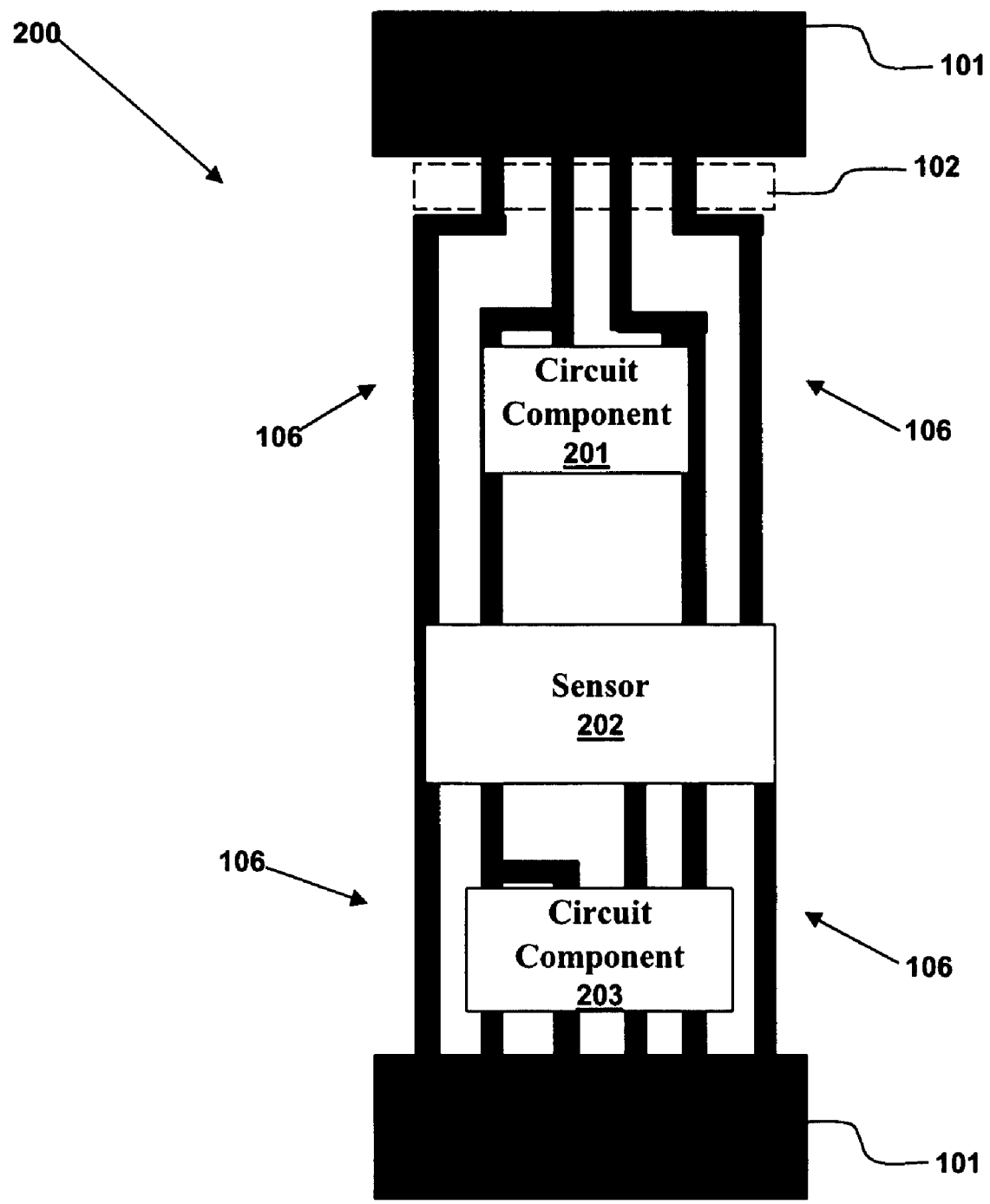
FIG. 2 illustrates a populated lead frame in accordance with aspects of the embodiments.

FIG. 2 illustrates a populated lead frame 200 in accordance with aspects of the embodiments. Circuit components 201, 203 now occupy the component sections and a sensor 202 occupies the sensor section.

Figure 3:
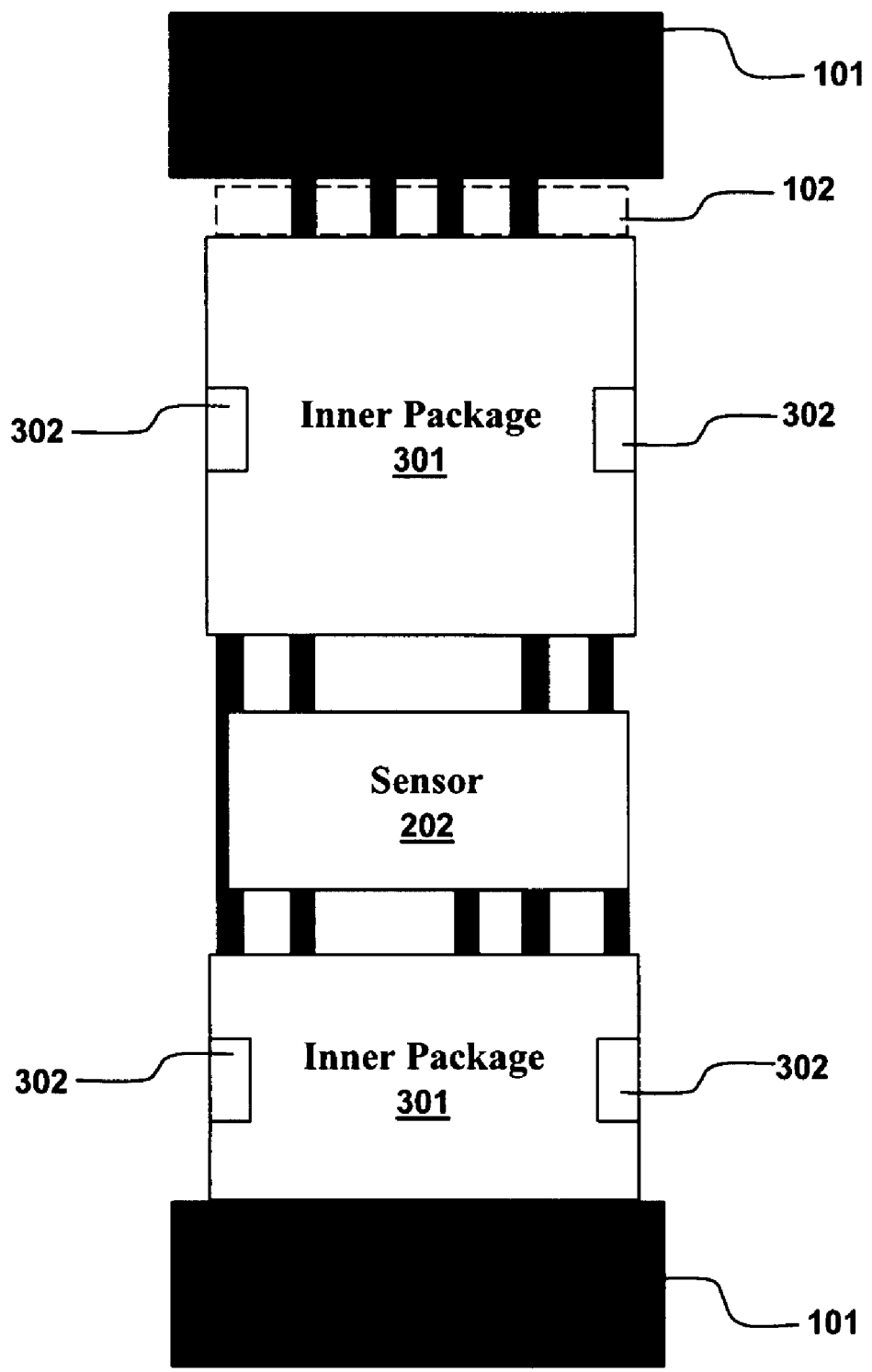
FIG. 3 illustrates a populated lead frame with inner packages affixed in accordance with aspects of the embodiments.

FIG. 3 illustrates a populated lead frame with inner packages 301 affixed in accordance with aspects of the embodiments. The inner packages 301 cover the electrical components and have alignment indentations 302 in the alignment zones.

Figure 4:
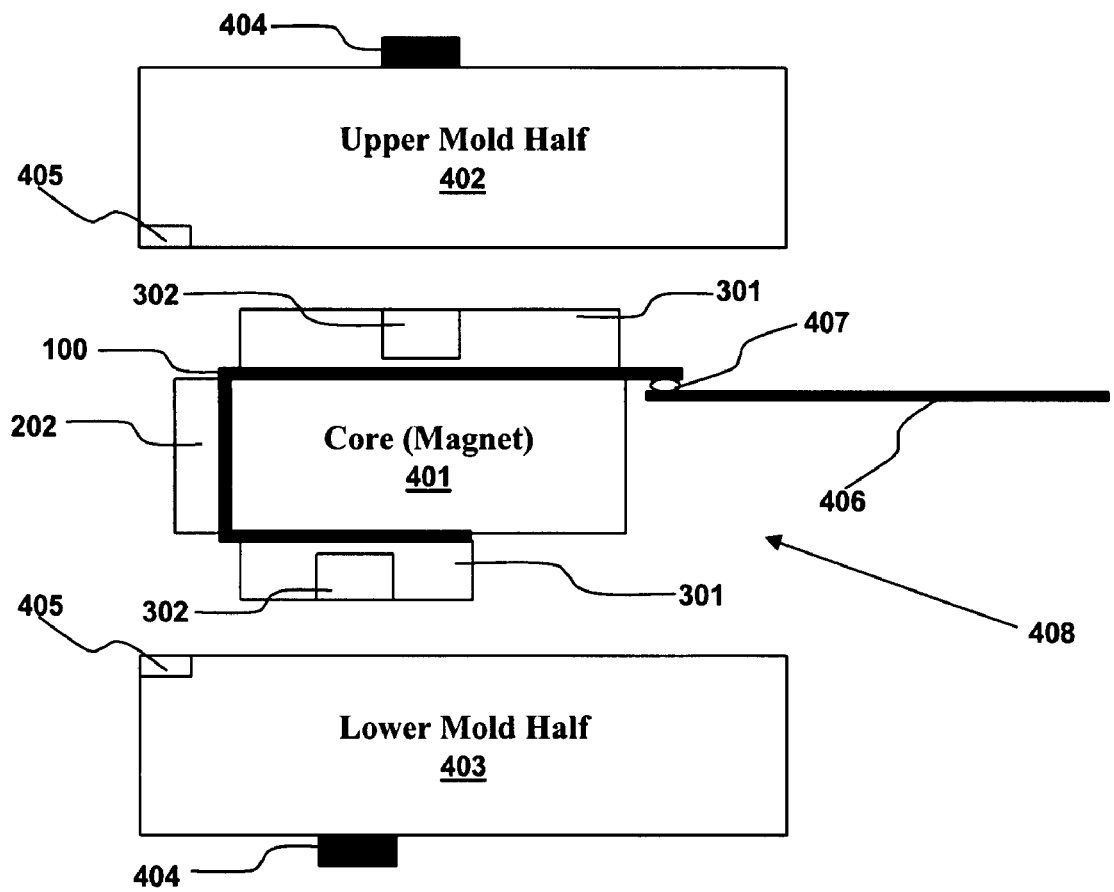
FIG. 4 illustrates an inner assembly and a mold in accordance with aspects of the embodiments.

FIG. 4 illustrates an inner assembly 408 and a mold in accordance with aspects of the embodiments. The inner assembly 408 has been wrapped around and attached to a core 401. The illustrated core 401 is a magnet that can bias a magnetic field sensor such as a Giant Magneto Resistive (GMR) device. An interconnect 406 is joined to the lead frame 100.

The mold has two halves, an upper half 402 and a lower half 403. Movable pins 404 protrude into the mold to engage the alignment indentations 302. Plastic can be flowed into the mold through a hole 405.

Figure 5:
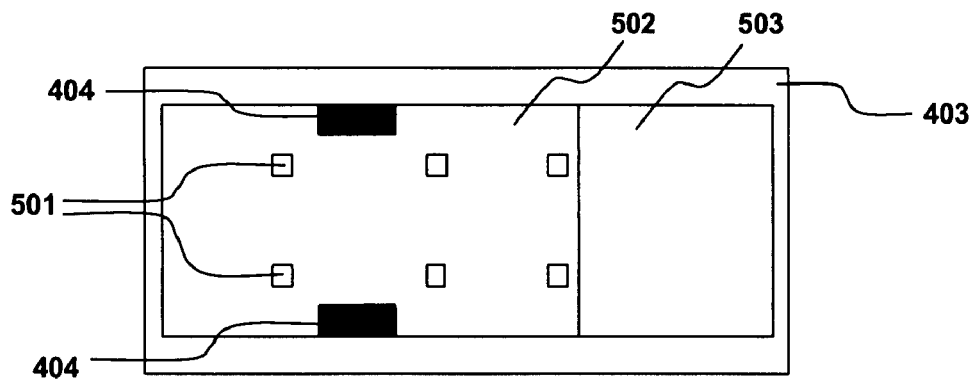
FIG. 5 illustrates a mold half with movable pins and thinned sections in accordance with aspects of the embodiments.

FIG. 5 illustrates a mold half with movable pins 404 and thinned sections 501 in accordance with aspects of the embodiments. The illustrated mold half is the lower mold half 403 also illustrated in FIG. 4. A mold can have sections of different shape, thickness, or shape such as fore section 502 that can be thicker than hind section 503. The thinned sections 501 allow heat to flow from adjacent plastic more quickly such that plastic near the thinned sections 501 sets more quickly than the rest of the plastic. Those skilled in the arts of plastics or plastic molding are familiar with molding systems and techniques for causing certain specific volumes of plastic to set earlier or later than other specific volumes.

Figure 6:
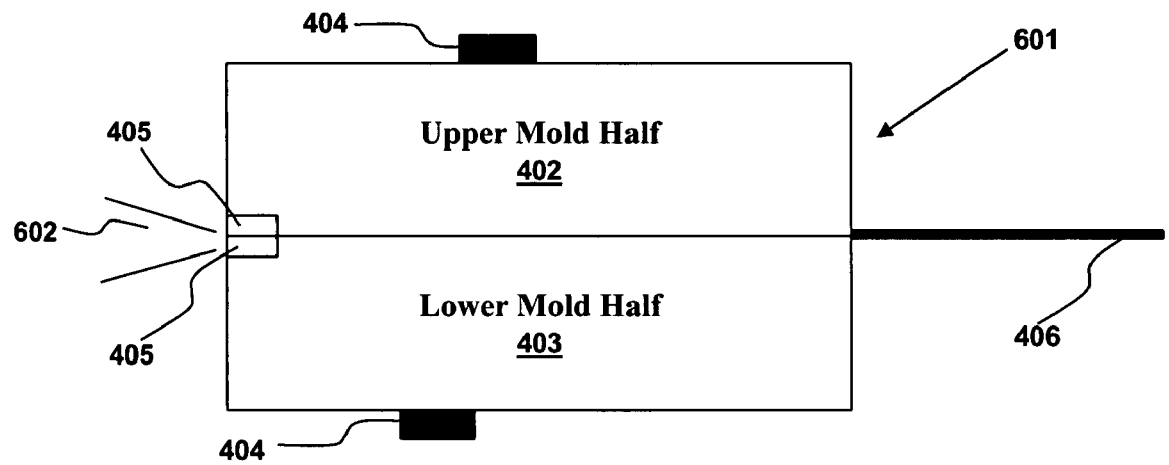
FIG. 6 illustrates a mold with movable pins holding an inner assembly in alignment in accordance with aspects of the embodiments.

FIG. 6 illustrates a mold 601 with movable pins 404 holding an inner assembly in alignment in accordance with aspects of the embodiments. The upper mold half 402 and the lower mold half 403 are pressed together and the alignment pins 404 engage the alignment indentations in the inner assembly. Plastic 602 is flowed into the hole 405 and allowed to set. The plastic near the thinned areas sets first and locks the inner package in position. After the plastic near the thinned areas sets, the movable pins 404 can be retracted without the inner package shifting within the mold 601. After all the plastic has set, the mold 601 can release the sealed sensor assembly.

Figure 7:
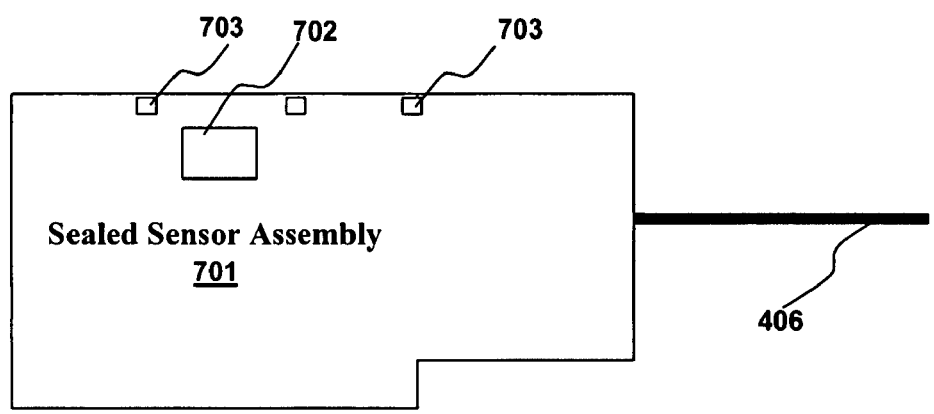
FIG. 7 illustrates a sealed sensor assembly in accordance with aspects of the embodiments.

FIG. 7 illustrates a sealed sensor assembly 701 in accordance with aspects of the embodiments. The sealed sensor assembly has two segments in conformance with the mold, although a single segment or many segments can be formed while still in conformance with the embodiments. An aspect of the illustrated embodiment is that it is cylindrical. Indentations 703 can form at the locations of the thinned areas. A pin mark 702 can form at the location of the movable pin. Alternatively, the movable pin can be formed such that no pin mark 702 is formed.

Figure 8:
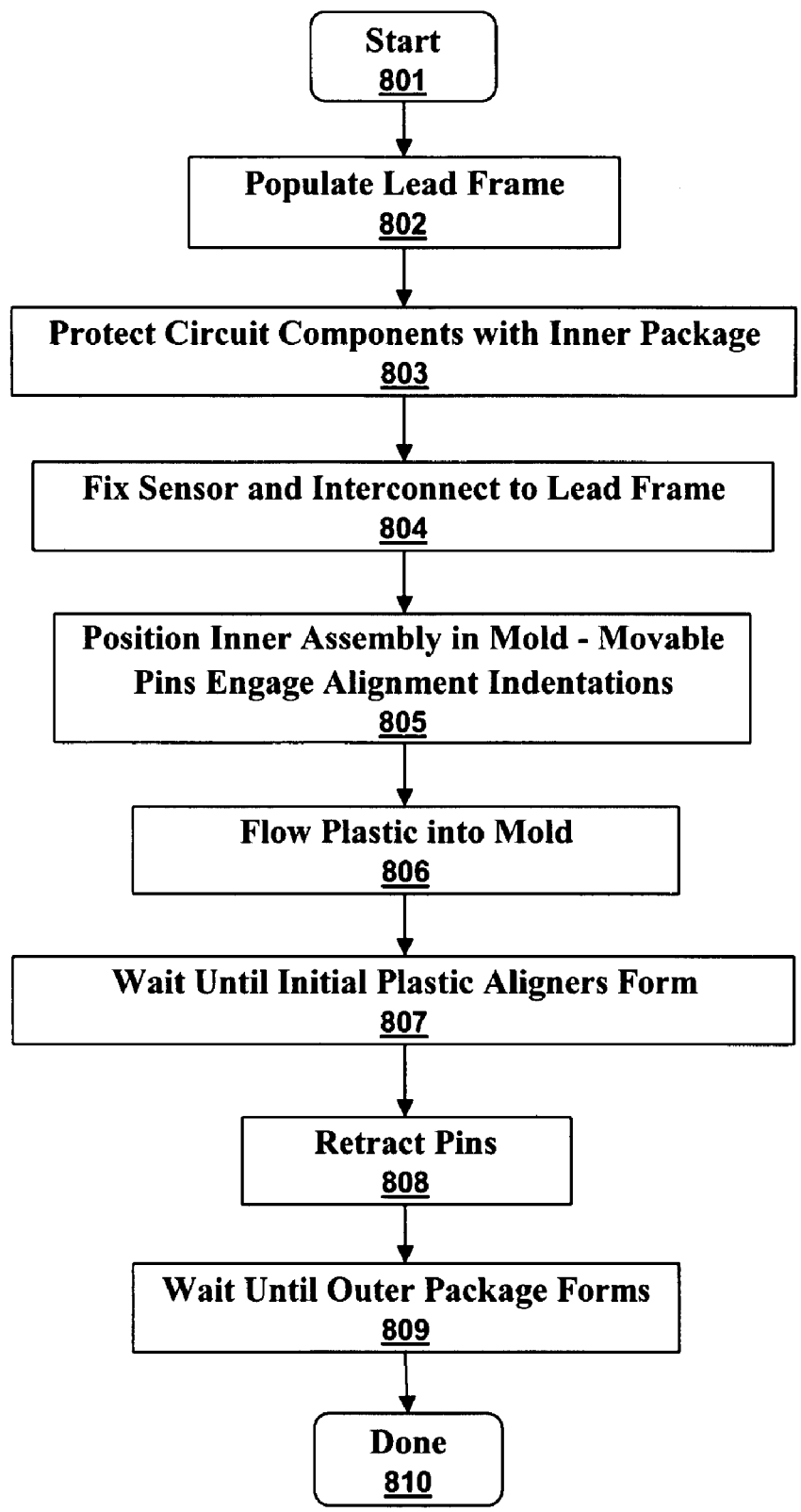
FIG. 8 illustrates a high level flow diagram of forming a sealed sensor assembly in accordance with aspects of the embodiments.

FIG. 8 illustrates a high level flow diagram of forming a sealed sensor assembly in accordance with aspects of the embodiments. After the start 801, a lead frame is populated with the electrical components 802. The circuit components are then protected by the inner package 803. A core and interconnect can then be fixed to the lead frame 804. The inner assembly is then positioned within the mold 805 and plastic flowed into the mold 806. Due to the mold configuration, some of the plastic sets and forms plastic aligners before the rest of the plastic sets. The plastic aligners hold the inner assembly in a properly aligned position. Waiting until the plastic aligners form 807 before retracting the movable pins 809 keeps the inner assembly from moving inside the mold before the rest of the plastic sets to form the outer package 809 of the sealed sensor assembly. The process is the complete 810. Note that certain common steps such as singulating and forming the populated lead frame and washing away flux are not shown because they are well known to those practiced in the arts of sensor assembly, circuit encapsulation, and semiconductor chip packaging.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The embodiments of the invention in which an exclusive property or right is claimed are defined as follows. Having thus described the invention what is claimed is:

1. A method comprising:

populating a lead frame with at least one circuit component wherein the lead frame has a length axis and a width axis;

protecting the at least one circuit component wherein at least one inner package is fixedly attached to the lead frame and covers the at least one circuit component, wherein the at least one inner package comprises at least one alignment indentation positioned over a lead frame outside edge, and wherein every lead frame outside edge is parallel to the length axis and perpendicular to the width axis;

fixing a sensor and an interconnect to the lead frame to thereby form an inner assembly wherein the sensor and the interconnect are electrically connected to the at least one circuit component;

positioning the inner assembly within a mold wherein at least one movable pin engages the at least one alignment indentation to hold the inner assembly in alignment within the mold;

flowing plastic into mold wherein the mold is configured to cause some of the plastic to set and thereby hold the inner assembly in alignment with the mold;

moving the at least one movable pin out of engagement with the inner assembly such that plastic flows into the at least one alignment indentation;

waiting for the plastic to set and thereby produce a sealed sensor assembly.

2. The method of claim 1 further comprising folding the inner assembly over an inner core and fixing the inner assembly over the inner core before positioning the inner assembly with the mold.

3. The method of claim 2 wherein the inner core comprises a multiplicity of faces such that the component section is fixed over one of the faces and the sensor section is fixed over another of the faces.

4. The method of claim 3 wherein the inner core comprises a magnet.

5. The method of claim 4 wherein a thermoplastic is flowed into the mold.

6. The method of claim 1 wherein a thermoplastic is flowed into the mold.

7. A method comprising:

populating a lead frame with at least one circuit component wherein the lead frame has a length axis and a width axis wherein the lead frame comprises at least three sections arranged along and straddling the length axis wherein the at least three sections comprise an interconnect section, a component section, and a sensor section, and wherein the at least one circuit component populates the component section;

protecting the at least one circuit component wherein a thermoset plastic is flowed over the component section and allowed to set and thereby form an inner package, wherein the inner package comprises an alignment indentation positioned over a lead frame outside edge, and wherein every lead frame outside edge is parallel to the length axis and perpendicular to the width axis;

fixing a sensor to the sensor section and fixing an interconnect to the interconnect section wherein the sensor and the interconnect are electrically connected to the at least one circuit component to form an inner assembly;

positioning the inner assembly within a mold wherein a movable pin engages the alignment indentation to hold the inner assembly in alignment within the mold;

flowing plastic into mold wherein the mold is configured to cause some of the plastic to set before the rest of the plastic and thereby hold the inner assembly in alignment with the mold;

moving the at least one movable pin out of engagement with the inner assembly such that unset plastic flows into the at least one alignment indentation;

waiting for the plastic to fully set to thereby produce a sealed sensor assembly.

8. The method of claim 7 further comprising folding the inner assembly over an inner core and fixing the inner assembly over the inner core before positioning the inner assembly with the mold.

9. The method of claim 8 wherein the inner core comprises a multiplicity of faces such that the component section is fixed over one of the faces and the sensor section is fixed over another of the faces.

10. The method of claim 9 wherein the inner core comprises a magnet.

11. The method of claim 10 wherein a thermoplastic is flowed into the mold.

12. The method of claim 8 wherein the inner core comprises a magnet.

13. The method of claim 7 wherein a thermoplastic is flowed into the mold.

14. A method comprising:

populating a lead frame with circuit components wherein the lead frame has a length axis and a width axis, wherein the lead frame comprises four sections arranged along and straddling the length axis wherein the four sections comprise an interconnect section, a first component section adjacent to the interconnect section, a sensor section adjacent to the first component section, and a second component section adjacent to the sensor section, and wherein the circuit components populate the first component section and the second component section;

protecting the circuit components wherein two inner package sections are fixedly attached to the lead frame and over the first component section and the second component section, wherein the inner package sections each comprise at least one alignment indentation positioned over a lead frame outside edge, and wherein every lead frame outside edge is parallel to the length axis and perpendicular to the width axis;

fixing a sensor to the sensor section and fixing an interconnect to the interconnect section wherein the sensor and the interconnect are electrically connected to the at least one circuit component;

folding the lead frame and fixing it over an inner core to thereby form an inner assembly;

positioning the inner assembly within a mold wherein movable pins engage the alignment indentations to hold the inner assembly in alignment within the mold;

flowing plastic into the mold wherein the mold is configured to cause some of the plastic to set and to thereby hold the inner assembly in alignment with the mold;

moving the movable pins out of engagement with the inner assembly such that the plastic flows into the alignment indentations; and waiting for the plastic to set and thereby produce a sealed sensor assembly.

15. The method of claim 14 wherein the inner core comprises a multiplicity of faces such that the first component section is fixed over one of the faces, the sensor section is fixed over another of the faces, and the second component section is fixed over yet another of the faces.

16. The method of claim 15 wherein the inner core comprises a magnet.

17. The method of claim 16 wherein the two inner package sections comprise thermoset plastic and are formed in place over the first component section and over the second component section.

18. The method of claim 14 wherein the two inner package sections comprise thermoset plastic and are formed in place over the first component section and over the second component section.

19. The method of claim 15 wherein the two inner package sections comprise thermoset plastic and are formed in place over the first component section and over the second component section.

20. The method of claim 14 wherein a thermoplastic is flowed into the mold.

* * * * *